(12) United States Patent
Matsumoto

(10) Patent No.: US 12,294,138 B2
(45) Date of Patent: May 6, 2025

(54) RFID MODULE

(71) Applicant: Murata Manufacturing Co., Ltd., Nagaokakyo (JP)

(72) Inventor: Kengo Matsumoto, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 0 days.

(21) Appl. No.: 18/644,241

(22) Filed: Apr. 24, 2024

(65) Prior Publication Data
US 2024/0273329 A1   Aug. 15, 2024

Related U.S. Application Data

(63) Continuation of application No. PCT/JP2023/031799, filed on Aug. 31, 2023.

(30) Foreign Application Priority Data

Sep. 2, 2022   (JP) .................................. 2022-140116
Nov. 21, 2022   (JP) .................................. 2022-185616

(51) Int. Cl.
*H01Q 1/22* (2006.01)
*G06K 19/077* (2006.01)
(Continued)

(52) U.S. Cl.
CPC ..... *H01Q 1/2208* (2013.01); *G06K 19/07722* (2013.01); *G06K 19/0775* (2013.01); *H01Q 1/36* (2013.01); *H01Q 7/00* (2013.01)

(58) Field of Classification Search
CPC .......... H01Q 1/2208; H01Q 1/36; H01Q 7/00; G06K 19/07722; G06K 19/0775
(Continued)

(56) References Cited

U.S. PATENT DOCUMENTS 6,009,350 A * 12/1999 Renken ..................... H01Q 7/08
128/903
8,544,754 B2   10/2013 Kato et al.
(Continued)

FOREIGN PATENT DOCUMENTS

JP   H09-116247 A   5/1997
JP   2002-230501 A   8/2002
(Continued)

OTHER PUBLICATIONS

International Search Report received for PCT Patent Application No. PCT/JP2023/031799, mailed on Oct. 3, 2023, 3 pages.
(Continued)

*Primary Examiner* — Michael G Lee
*Assistant Examiner* — David Tardif
(74) *Attorney, Agent, or Firm* — ArentFox Schiff LLP

(57) ABSTRACT

An RFID module is provided that includes a substrate having first and second main surfaces; an RFIC chip and a coil conductor on the first main surface; and a first conductor pattern within the substrate. The coil conductor includes a plurality of coil elements each having a pair of legs and a bridge connecting first ends of the pair of legs. The coil elements are arranged in a row across a predetermined winding axis; and a second conductor pattern is on the first main surface and connects with the coil elements to form a coil shape. A first end of the RFIC chip is connected to a first end of the coil conductor. The first conductor pattern is between the second ends of the RFIC chip and the coil conductor. The first conductor pattern has a fold-back portion where the direction in which the pattern extends is folded back.

20 Claims, 7 Drawing Sheets

(51) Int. Cl.
*H01Q 1/36* (2006.01)
*H01Q 7/00* (2006.01)

(58) Field of Classification Search
USPC .......................................................... 235/488
See application file for complete search history.

(56) References Cited

U.S. PATENT DOCUMENTS

| | | | |
|---|---|---|---|
| 9,160,056 B2* | 10/2015 | Nickel | H01Q 1/48 |
| 9,214,728 B2 | 12/2015 | Tsubaki et al. | |
| 10,020,582 B2 | 7/2018 | Tsubaki et al. | |
| 10,170,836 B2 | 1/2019 | Yosui et al. | |
| 11,615,918 B2 | 3/2023 | Banba et al. | |
| 2003/0189524 A1* | 10/2003 | Wilcoxson | H01Q 1/36 |
| | | | 343/742 |
| 2009/0065594 A1 | 3/2009 | Kato et al. | |
| 2011/0316693 A1 | 12/2011 | Loen | |
| 2014/0176383 A1 | 6/2014 | Yosui et al. | |
| 2014/0203985 A1 | 7/2014 | Tsubaki et al. | |
| 2016/0043469 A1 | 2/2016 | Tsubaki et al. | |
| 2017/0344873 A1 | 11/2017 | Pochiraju et al. | |
| 2018/0040947 A1* | 2/2018 | Cheng | H01L 23/66 |
| 2019/0006076 A1 | 1/2019 | Yazaki | |
| 2019/0156175 A1* | 5/2019 | Eshima | G06K 19/025 |
| 2020/0118740 A1 | 4/2020 | Banba et al. | |
| 2021/0066265 A1 | 3/2021 | Eid et al. | |
| 2021/0089851 A1 | 3/2021 | Ueki et al. | |
| 2021/0312255 A1 | 10/2021 | Ji | |
| 2023/0187131 A1 | 6/2023 | Banba et al. | |

FOREIGN PATENT DOCUMENTS

| | | |
|---|---|---|
| JP | 2009-020835 A | 1/2009 |
| JP | 2009-025855 A | 2/2009 |
| JP | 2015-130607 A | 7/2015 |
| WO | 00/21030 A1 | 4/2000 |
| WO | 2007/138857 A1 | 12/2007 |
| WO | 2013/161608 A1 | 10/2013 |
| WO | 2013/168558 A1 | 11/2013 |
| WO | 2017/179612 A1 | 10/2017 |
| WO | 2018/235714 A1 | 12/2018 |
| WO | 2021/059565 A1 | 4/2021 |

OTHER PUBLICATIONS

International Search Report received for PCT Patent Application No. PCT/JP2023/031806, mailed on Oct. 10, 2023, 3 pages.

* cited by examiner

RFID MODULE

CROSS REFERENCE TO RELATED APPLICATIONS

This application is a continuation of International Application No. PCT/JP2023/031799, filed Aug. 31, 2023, which claims priority to Japanese Patent Application No. 2022-140116, filed Sep. 2, 2022, and to Japanese Patent Application No. 2022-185616, filed Nov. 21, 2022, the entire contents of each of which are hereby incorporated by reference in their entirety.

TECHNICAL FIELD

The present disclosure relates to an RFID module having a substrate mounted with a coil conductor.

BACKGROUND

Conventionally, products are managed by attaching a radio-frequency identification (RFID) module, which is a wireless communication device, to the products. One type of the RFID module is one in which a radio-frequency integrated circuit (RFIC) chip and a coil conductor functioning as an antenna are arranged on an insulating substrate.

For example, International Publication No. WO 2018/235714 (hereinafter "Patent Document 1") describes an RFID module that includes a coil conductor in which coil elements are arranged in a row.

However, in the RFID module disclosed in Patent Document 1, it is difficult to lower the resonance frequency, and when the communication frequency is in a low frequency band, the resonance point may shift. Moreover, if a capacitor, a coil, or the like is used to lower the resonance frequency, the overall size of the module will increase.

SUMMARY OF THE INVENTION

In view of the foregoing, it is an object of the exemplary aspects of the present disclosure to provide an RFID module that does not increase in size while lowering the resonance frequency.

In an exemplary aspect, an RFID module is provided that includes a substrate having a first main surface and a second main surface that oppose other; an RFIC chip on the first main surface side of the substrate; a coil conductor on the first main surface side of the substrate; and a first conductor pattern within the substrate. The coil conductor includes a plurality of coil elements that each have a pair of legs and a bridge connecting one ends of the pair of legs. The plurality of coil elements are arranged in a row across a predetermined winding axis. Moreover, a second conductor pattern is arranged on the first main surface and connects with the coil elements to form a coil shape. A first end of the RFIC chip is connected to a first end of the coil conductor. The first conductor pattern is connected between the second end of the RFIC chip and the second end of the coil conductor. Furthermore, the first conductor pattern has a fold-back portion where the direction in which the pattern extends is folded back.

According to the exemplary aspects of the present disclosure, an RFID module is provided that does not increase in size while also lowering the resonance frequency.

DETAILED DESCRIPTION

Figure 1:
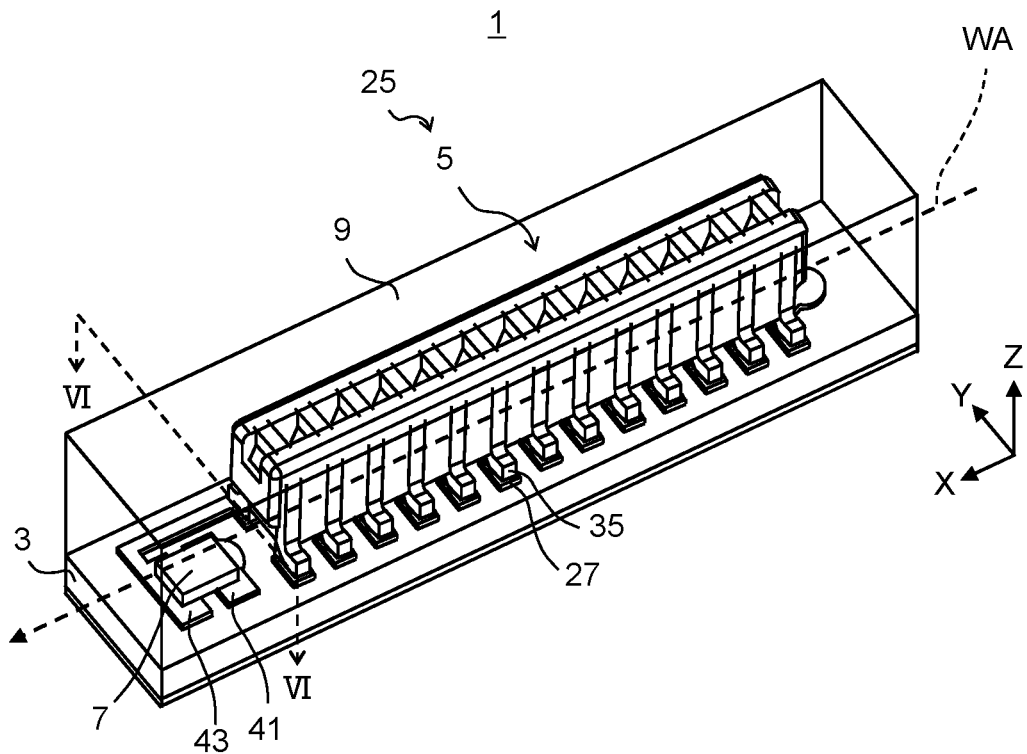
FIG. 1 is a transparent perspective view showing an outline of an RFID module of an exemplary embodiment.

An RFID module of a first exemplary aspect includes a substrate having a first main surface and a second main surface that oppose each other; an RFIC chip on the first main surface side of the substrate; a coil conductor on the first main surface side of the substrate; and a first conductor pattern within the substrate. The coil conductor includes a plurality of coil elements that each have a pair of legs and a bridge connecting first ends of the pair of legs. The plurality of coil elements are arranged in a row across a predetermined winding axis; and a second conductor pattern is on the first main surface and connects with the coil elements to form a coil shape. A first end of the RFIC chip is connected to a first end of the coil conductor. The first conductor pattern is connected between the second end of the RFIC chip and the second end of the coil conductor. The first conductor pattern has a fold-back portion where the direction in which the pattern extends is folded back.

In the RFID module of the exemplary aspect, the first conductor pattern as a part of the resonance circuit has the fold-back portion where the direction in which the pattern extends is folded back, so that the pattern length is increased and the inductance of the first conductor pattern is also increased. This configuration effectively lowers the resonance frequency of the RFID module 1. Since no coil components or capacitors are required to lower the resonance frequency, the size of the RFID module 1 does not need to be increased to lower the resonance frequency.

According to a second exemplary aspect of the RFID module, the first conductor pattern is a meandering pattern that has a rectilinear pattern extending in the longitudinal direction of the substrate and the fold-back portion where the direction in which the rectilinear pattern extends is folded back. Since the first conductor pattern is a meandering pattern, it is easier to design the length of the first conductor pattern for a desired resonance frequency.

According to a third exemplary aspect of the RFID module, the substrate includes a first base material layer on the first main surface side and a second base material layer on the second main surface side. The first base material layer is laminated on the first main surface side of the second base material layer, and the first conductor pattern is on the second base material layer. The RFID module includes first and second interlayer connection conductors that each extend through the first base material layer and the second base material layer. The second end of the RFIC chip and a first end of the first conductor pattern are connected via the first interlayer connection conductor, while the second end of the first conductor pattern and the second end of the coil conductor are connected via the second interlayer connection conductor. The first and second interlayer connection conductors confront each other in the longitudinal direction of the first base material layer and the second base material layer, and the first conductor pattern is arranged between the first and second interlayer connection conductors. Since the first conductor pattern is arranged between the first and second interlayer connection conductors, even if the RFID module comes into contact with another article during the manufacturing process or handling after manufacturing, for example, the first conductor pattern is protected from being scraped off.

According to a fourth exemplary aspect of the RFID module, first and second lands that are electrodes are arranged on the first main surface side of the first base material layer; and a second electrode is provided that faces the first land and the second land and is connected to the first interlayer connection conductor. The second end of the RFIC chip is connected to the first land, with a first end of the RFIC chip being connected to the second land. The first land is connected to a first end of the first conductor pattern, and a first end of the coil conductor is connected to the second land. The second electrode is positioned closer to the RFIC chip than the first conductor pattern. Since the second electrode faces the first land and the second land, a capacitance component is generated. Moreover, positioning the second electrode closer to the RFIC chip than the first conductor pattern enables the generation of a greater capacitance component.

According to a fifth exemplary aspect of the RFID module, the second electrode is on the first main surface side of the second base material layer, whereas the first conductor pattern is on the second main surface side of the second base material layer. Since the second electrode and the first conductor pattern are arranged apart from each other, the generation of a capacitance component between the first conductor pattern and the first land and the second land can be reduced, which facilitates designing the area of the second electrode generating a capacitance component and the length of the first conductor pattern generating inductance.

According to a sixth exemplary aspect, the RFID module includes a third base material layer on which the second main surface side of the second base material layer is stacked. Since the third base material layer covers the first conductor pattern on the second major surface side of the second base material layer, the first conductor pattern is prevented from rubbing against another object and peeling off.

According to a seventh exemplary aspect of the RFID module, the second conductor pattern includes a plurality of first electrodes each connected to the other ends of the pair of legs of each of the plurality of coil elements; and a wiring conductor that connects a first electrode connected to one of the second ends of the pair of legs of the coil element and a first electrode connected to the other of the second ends of the pair of legs of a coil element adjacent to the coil element. The plurality of first electrodes and the wiring conductor are arranged on the first main surface side of the first base material layer.

Exemplary embodiments described below each show a specific example of the present disclosure, but it is noted that these embodiments are not limited to these particular configurations. Moreover, it is noted that the numerical values, shapes, configurations, steps, sequence of steps, and the like specifically shown in the following embodiments are merely examples and are not intended to limit the present invention. In all the embodiments, the same applies to configurations in their variants, and the configurations described in the variants may be combined with each other as would be appreciated to one skilled in the art.

EXEMPLARY EMBODIMENTS

Figure 2:
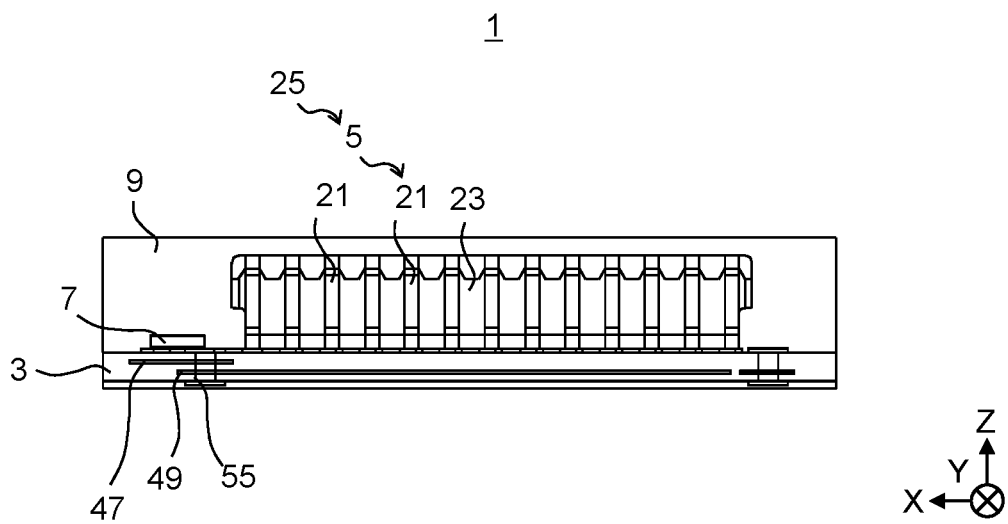
FIG. 2 is a transparent side view of the RFID module of the exemplary embodiment.

A schematic configuration of an RFID module 1 according to an exemplary embodiment will now be described. In particular, FIG. 1 is an overall perspective view of the RFID module 1 of the exemplary embodiment. FIG. 2 is a side transparent view of the RFID module 1 of the exemplary embodiment. In the figures, the XYZ coordinate system is provided to facilitate understanding of the exemplary embodiment and is not intended to limit the invention. For purposes of this disclosure, the X-axis direction indicates the longitudinal direction of the RFID module 1, the Y-axis direction indicates the depth (e.g., width) direction, and the Z-axis direction indicates the thickness direction. The X, Y, and Z directions are orthogonal to each other. In the exemplary embodiment, the positive direction of the Z axis is described as an upward direction, and the negative direction of the Z axis is described as a downward direction.

According to an exemplary aspect, the RFID module 1 of the exemplary embodiment includes a laminated substrate 3, a coil assembly 5 and an RFIC chip 7 on a first main surface 3a, which is the upper surface of the laminated substrate 3, and a resin layer 9 for sealing the coil assembly 5 and the RFIC chip 7. The RFIC chip 7 has a first terminal 7a and a second terminal 7b which are input/output terminals (see, e.g., FIG. 5). A second main surface 3b, which is the lower surface of the laminated substrate 3, and the first main surface 3a face each other, i.e., that oppose each other.

Figure 5:
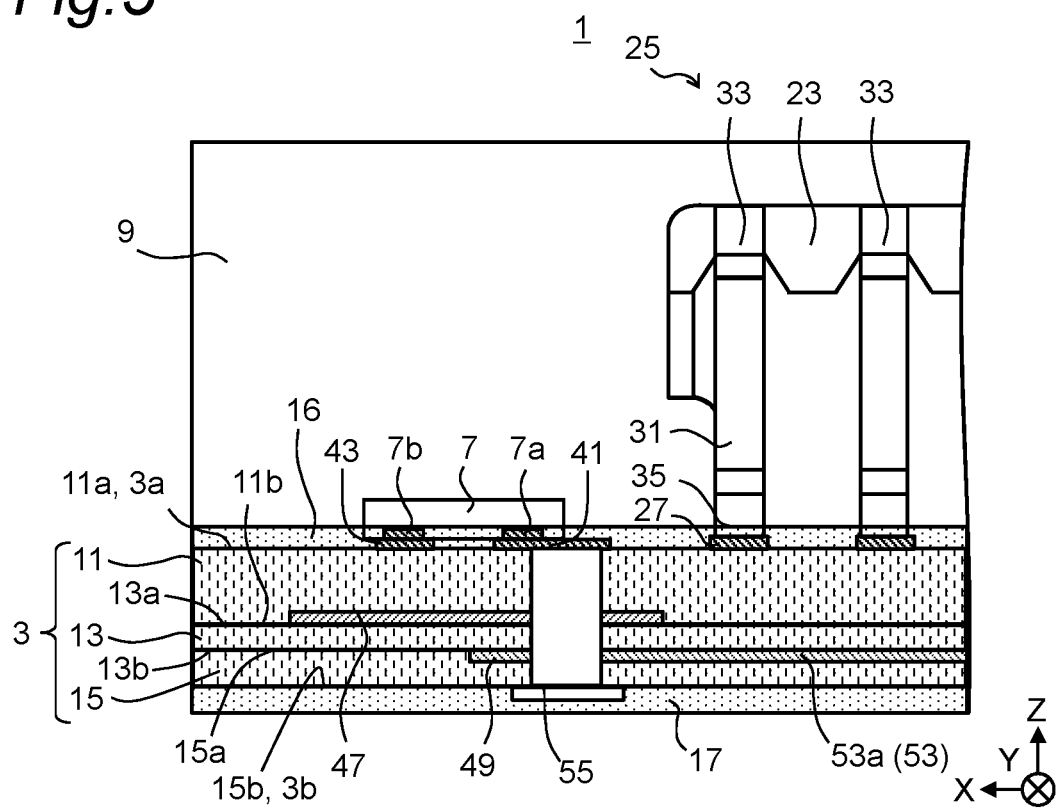
FIG. 5 is a partially enlarged sectional view of FIG. 2.
Figure 6:
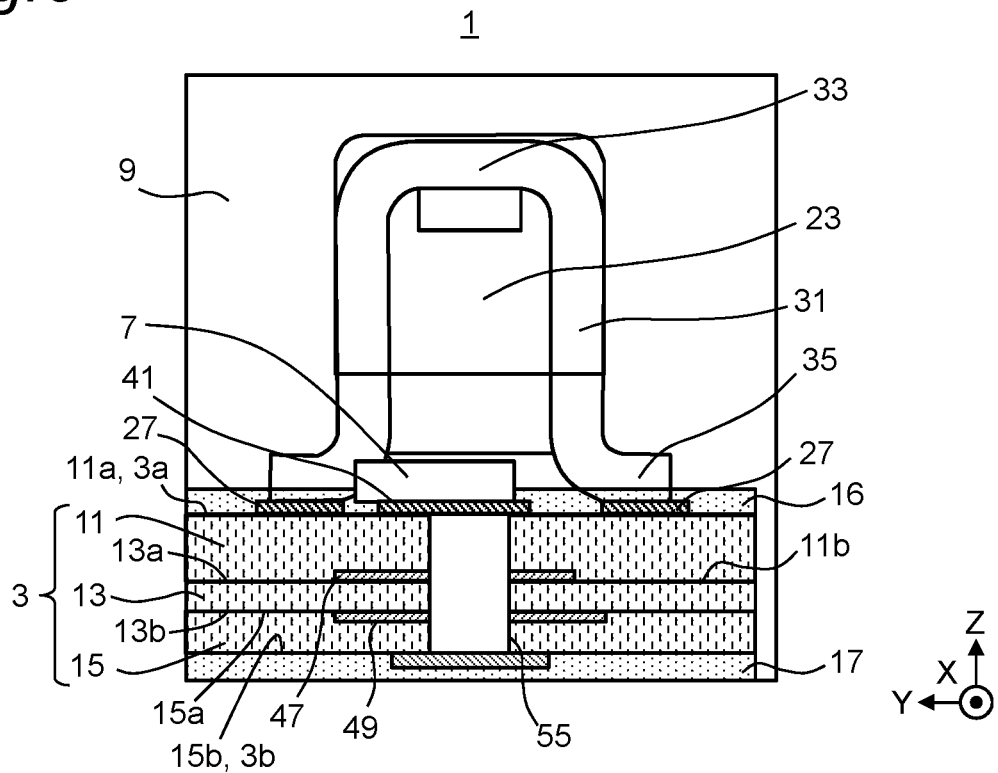
FIG. 6 is a longitudinal sectional view taken along an arrow VI in FIG. 1.

Referring to FIGS. 5 and 6, for example, the laminated substrate 3 has a first base material layer 11, a second base material layer 13, and a third base material layer 15, which are laminated toward the coil assembly 5 with the third base material layer 15 as a bottom base material, the second base material layer 13 laminated on the third base material layer 15, and the first base material layer 11 further laminated on the second base material layer 13. The first base material layer 11 to the third base material layer 15 are each insulative and are made of, for example, a glass epoxy base material or a ceramic base material.

For purposes of this disclosure, a third main surface 11a of the first base material layer 11 may correspond to the first main surface 3a of the laminated substrate 3. A fourth main surface 11b of the first base material layer 11 on the second main surface 3b side is in contact with a fifth main surface 13a of the second base material layer 13 on the first main surface 3a side. A sixth main surface 13b of the second base material layer 13 on the second main surface 3b side is in contact with a seventh main surface 15a of the third base material layer 15 on the first main surface 3a side. An eighth main surface 15b, which is the lower surface of the third base material layer 15, faces the seventh main surface 15a and corresponds to the second main surface 3b of the laminated substrate 3.

As further shown, a first resist layer 16 is laminated on the first main surface 3a of the laminated substrate 3, and a second resist layer 17 is laminated on the face of the second main surface 3b of the laminated substrate 3. The first resist layer 16 is provided to prevent electrodes and wiring arranged on the first base material layer 11 from short-circuiting, and the second resist layer 17 covers and protects the lower ends of a first interlayer connection conductor 55 and a second interlayer connection conductor 57, which will be described below. The first resist layer 16 and the second resist layer are, for example, insulating resin layers according to an exemplary aspect.

Figure 4:
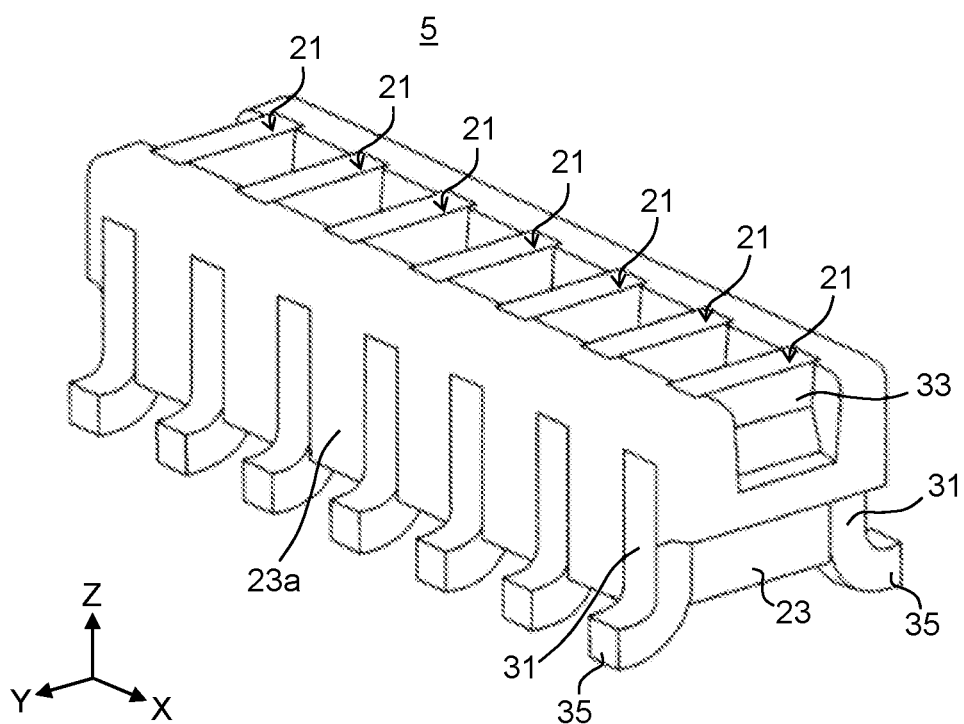
FIG. 4 is a perspective view of a coil assembly.

As shown in FIG. 4, the coil assembly 5 includes a plurality of coil elements 21 and a resin block 23 that integrates the plurality of coil elements 21. The RFID module 1 includes the plurality of coil elements 21 of the coil assembly 5 and a second conductor pattern 26 located on the third main surface 11a, which is the upper surface of the first base material layer 11, to thereby form a coil conductor 25 wound around a winding axis WA (see FIG. 1), the coil conductor 25 functioning as an antenna. The communication frequency band of the RFID module 1 of the exemplary embodiment can be, for example, a UHF band from 860 MHz to 960 MHz. The number of turns and dimensions of the coil assembly 5 can be changed depending on communication characteristics as would be appreciated to one skilled in the art.

Figure 3:
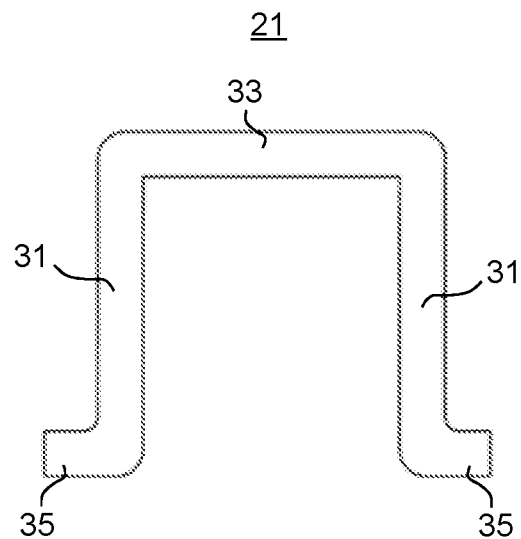
FIG. 3 is a front view of a coil element.

As shown in FIG. 3, the coil element 21 includes a pair of legs 31 arranged substantially parallel to each other, a bridge 33 connecting first ends of both the legs 31, and a substrate connection 35 bent at approximately 90 degrees at a tip of the second end of each of the legs 31.

The block 23 fixes the state of arrangement of the coil elements 21. As shown in FIG. 4, the block 23 can be filled with resin in an area surrounded by the legs 31 and the bridge 33 of each coil element 21. In other words, the block 23 does not have a recess for accommodating a coil core. The legs 31 of each coil element 21 are exposed from a side surface 23a of the block 23. The block 23 is formed of, for example, a thermoplastic resin such as a liquid crystal polymer, or a thermosetting resin according to exemplary aspects.

The coil elements 21 are each fixed to the block 23 at a position where the legs 31 and bridges 33 straddle the winding axis WA. When the coil assembly 5 is mounted on the first base material layer 11, the coil elements 21 are arranged and fixed in a direction parallel to the winding axis WA of the coil conductor 25, with their respective one legs 31 located on one side with respect to the winding axis WA and their respective other legs 31 located on the other side with respect to the winding axis WA (see FIGS. 1 and 4). It is noted that the substrate connections 35 of each coil element 21 are not covered with the block 23 so that each substrate connection 35 serves as a connection when the coil assembly 5 is mounted on the first base material layer 11.

The resin layer 9 seals the coil assembly 5 and the RFIC chip 7 and is laminated on the third main surface 11a of the first base material layer 11 and the first resist layer 16. The resin layer 9 is formed of, for example, a general sealing resin such as epoxy resin according to an exemplary aspect.

Figure 7A:
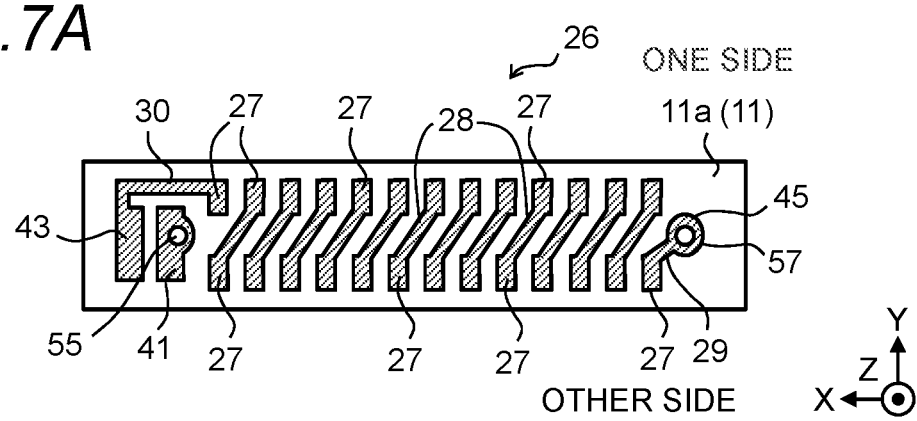
FIGS. 7A-7D are plan view showing base material layers of a laminated substrate.
Figure 7B:
Figure 7C:
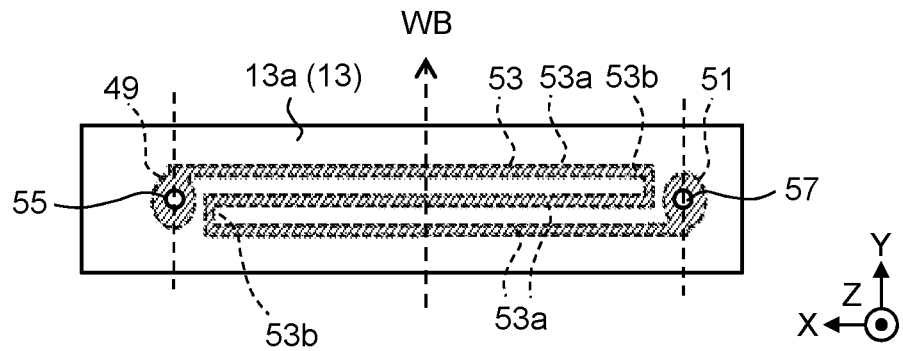
Figure 7D:

The laminated substrate 3 will then be described with reference to FIG. 7A to 7D. FIG. 7A to 7D are plan views showing the base materials of the laminated substrate 3. FIG. 7A is a plan view showing the third main surface 11a of the uppermost first base material layer 11. FIG. 7B is a plan view showing the fifth main surface 13a of the intermediate second base material layer 13. FIG. 7C is a transparent plan view seen through the fifth main surface 13a of the intermediate second base material layer 13. FIG. 7D is a plan view showing the seventh main surface 15a of the lowermost third base material layer 15.

As shown in FIG. 7A, the third main surface 11a, which is the upper surface of the first base material layer 11, has thereon a first land 41 and a second land 43 connected to a first terminal 7a and a second terminal 7b of the RFIC chip 7, respectively, and the second conductor pattern 26 connecting with each of the plurality of coil elements 21 to form a coil shape. The second conductor pattern 26 includes a plurality of first electrodes 27, wiring conductors 28, 29, and 30, and an auxiliary electrode 45. The wiring conductor 28 connects a first electrode 27 on one side (e.g., a positive side in the Y-axis direction) to a first electrode 27 on the other side (e.g., a negative side in the Y-axis direction), which is shifted by one in the positive direction of the X-axis. The first land 41 and the second land 43 are each a metal electrode (i.e., configured as first and second land electrodes) and are in contact with and electrically connected to the first terminal 7a and the second terminal 7b of the RFIC chip 7, respectively. The first electrode 27 on the other side farthest from the first land 41 is electrically connected to the auxiliary electrode 45 via the wiring conductor 29. The first electrode 27 on one side closest to the first land 41 is electrically connected to the second land 43 via the wiring conductor 30.

As shown in FIG. 7B, a second electrode 47 is located below the first land 41 and the second land 43 on the fifth main surface 13a, which is the upper surface of the second base material layer 13. The second electrode 47 faces the first land 41 and the second land 43 so that the first land 41 and the second land 43 and the second electrode 47 generate a capacitance C1.

As shown in FIGS. 5, 6, and 7C, auxiliary electrodes 49 and 51 and a first conductor pattern 53 are arranged on the sixth main surface 13b, which is the lower surface of the second base material layer 13. It is noted that FIG. 7C is a view seen through the fifth main surface 13a from above.

The laminated substrate 3 includes the first interlayer connection conductor 55 and the second interlayer connection conductor 57 each extending through the first base material layer 11 and the second base material layer 13. The first interlayer connection conductor 55 is a conductive via that connects the first land 41 to the second electrode 47 and the auxiliary electrode 49. The second interlayer connection conductor 57 is a conductive via that connects the auxiliary electrode 45 and the auxiliary electrode 51.

According to an exemplary aspect, the first and second interlayer connection conductors 55 and 57 are conductors, for example, that can be formed by solidifying (e.g., metallizing) a conductive paste filled in holes located in the insulating first base material layer 11 and second base material layer 13, but may also be plated-through holes. The first and second interlayer connection conductors 55 and 57 are arranged to confront each other in the longitudinal direction of the first base material layer 11 and the second base material layer 13.

Fold-back portions 53b of the first conductor pattern 53 are folded back in the direction in which the wiring pattern extends. The first conductor pattern 53 is, for example, a meandering pattern that has a rectilinear pattern 53a extending in the longitudinal direction of the second base material layer 13 (e.g., a longitudinal direction of the laminated substrate 3) and the fold-back portions 53b where the direction of extension of the rectilinear pattern 53a is folded back. The first conductor pattern 53 has three or more odd-numbered rectilinear patterns 53a and fold-back portions 53b, and connects the auxiliary electrode 49 and the auxiliary electrode 51.

In this way, since the amplitude direction of the meandering pattern is the longitudinal direction (i.e., the X-axis direction) of the second base material layer 13, the number of the fold-back portions 53b can be reduced and the difference in path length between the center and the inside of the meandering pattern can also be reduced, as compared to the case where the amplitude direction of the meandering pattern is the transverse direction (i.e., the Y-axis direction) of the second base material layer 13. Since current flowing through the meandering pattern tends to flow inside the meandering pattern, the difference can be reduced between the designed length of the meandering pattern and the actual length through which current flows, thereby reducing the deviation of the L component of the meandering pattern.

According to the exemplary aspect, the first conductor pattern 53 is located between the first and second interlayer connection conductors 55 and 57. Thus, since the first conductor pattern 53 is not located outside the first and second interlayer connection conductors 55 and 57 in the longitudinal direction, the first conductor pattern 53 can be protected from being scraped off in the event of contact or the like between the RFID module and other articles during the manufacturing process or handling after manufacturing, for example.

Moreover, a center axis WB of the amplitude of the first conductor pattern 53, which is a meandering pattern, intersects with the winding axis WA of the coil conductor 25, for example, orthogonally. This configuration reduces mutual interference between an inductance L1 of the coil conductor 25 and an inductance L2 of the first conductor pattern 53.

As shown in FIG. 7D, the third base material layer 15 is located below the second base material layer 13. By providing the laminated substrate 3 with the third base material layer 15 on which the second main surface 3b side of the second base material layer 13 is stacked, the first conductor pattern 53 is covered with the third base material layer 15, which prevents the first conductor pattern 53 from rubbing and peeling off. It is noted that the first interlayer connection conductor 55 and the second interlayer connection conductor 57 extend up to the seventh main surface 15a, which is the upper surface of the third base material layer 15.

As shown in FIGS. 5 and 6, the second electrode 47 is positioned closer to the RFIC chip 7 than the first conductor pattern 53 is. This configuration provides for a larger capacitance C1 to be generated relative to the size of the second electrode 47.

The first electrode 27, the wiring conductors 28, 29, and 30, the first land 41, the second land 43, the auxiliary electrode 45, the second electrode 47, the auxiliary electrodes 49 and 51, and the first conductor pattern 53 are each a conductor that can be made of a copper foil patterned by photolithography.

Figure 8:
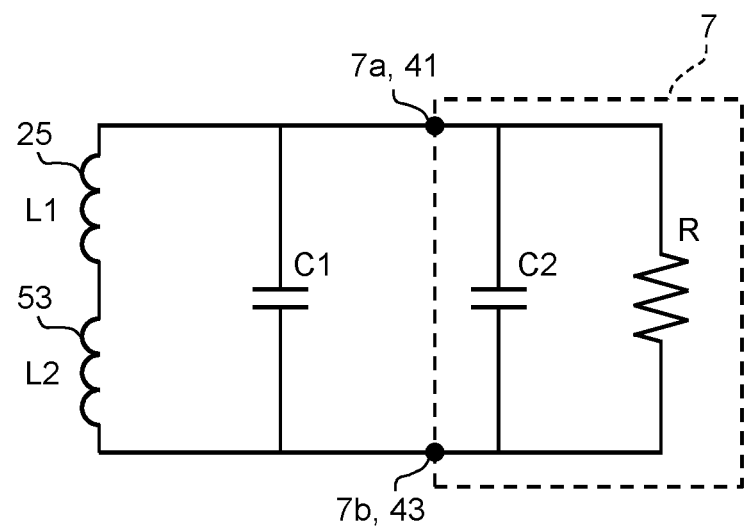
FIG. 8 is an equivalent circuit diagram of the RFID module.

A circuit configuration of the RFID module 1 will be described with reference to FIG. 8, which is an equivalent circuit diagram of the RFID module 1.

In particular, an LC parallel resonance circuit is configured within the RFID module 1 and is matched to radio waves at a communication frequency, so that when the coil conductor 25 receives radio waves at the communication frequency, current flows to the RFIC chip 7. The coil conductor 25 has the inductance L1, and the first conductor pattern 53 has the inductance L2. The capacitance C1 is formed by the first land 41, the second land 43, the first base material layer 11, and the second electrode 47. The RFIC chip 7 has therein a resistance R and a capacitance C2.

In this aspect, a combined inductance L of the RFID module 1 is L=L1+L2 from the inductances L1 and L2. A combined capacitance C of the RFID module 1 is C=C1+C2 from the capacitances C1 and C2. A resonance frequency f of the RFID module 1 is calculated from the following formula:

$$f = 1/(2\pi\sqrt{L \cdot C}) \quad \text{Formula (1)}$$

Thus, the longer the length of the coil conductor 25, the larger the inductance L1 becomes, and the larger the combined inductance L also becomes, resulting in a smaller resonance frequency f. The larger the capacitance C1, the larger the combined capacitance C also becomes, and the smaller the resonance frequency f becomes. Conventional RFID modules cannot cope with the need to reduce the resonance frequency with the communication frequency, but the RFID module 1 of the first exemplary embodiment can reduce the resonance frequency by lengthening the coil conductor 25 of the meander pattern, or by increasing the area of the second electrode, or by both such modifications.

As described above, the RFID module 1 of the exemplary embodiment includes the laminated substrate 3 having the first main surface 3a and the second main surface 3b facing each other, the RFID chip 7 located on the first main surface 3a side of the laminated substrate 3, the coil conductor 25 located on the first main surface 3a side of the laminated substrate 3, and the first conductor pattern 53 lying within the laminated substrate 3. The coil conductor 25 includes the plurality of coil elements 21 arranged in a row across the predetermined winding axis, each having the pair of legs 31 and the bridge 33 connecting first ends of the legs 31, and the second conductor pattern 26 located on the first main surface 3a and connecting with the coil elements 21 to form a coil shape. A first end of the RFIC chip 7 is connected to a first end of the coil conductor 25, and the first conductor pattern 53 is connected between the second end of the RFIC chip 7 and the second end of the coil conductor 25, the first conductor pattern 53 having the fold-back portions 53b where the direction of extension of the pattern is folded back.

According to the RFID module 1 having this configuration, the first conductor pattern 53, which is a part of the resonance circuit, has the fold-back portions 53b where the extending direction of the pattern is folded back, so that the pattern length can be increased and the inductance of the first conductor pattern can also be increased. This configuration enables the resonance frequency of the RFID module 1 to be lowered. Since no coil components or capacitors are required to lower the resonance frequency, there is no need to increase the size of the RFID module 1 to lower the resonance frequency.

Moreover, the laminated substrate 3 includes the first base material layer 11 located on the first main surface 3a side and the second base material layer 13 located on the second main surface 3b side. The first base material layer 11 is laminated on the first main surface 3a side of the second base material layer 13, and the first conductor pattern 53 is located on the second base material layer 13. The RFID module 1 includes first and second interlayer connection conductors 55 and 57 that each extend through the first base material layer 11 and the second base material layer 13. The first land 41 at the second end of the RFIC chip 7 and a first end of the first conductor pattern 53 are connected via the first interlayer connection conductor 55. The second end of the first conductor pattern 53 and the auxiliary electrode 45 at the second end of the coil conductor 25 are connected via the second interlayer connection conductor 57. The first and second interlayer connection conductors 55 and 57 confront each other in the longitudinal direction of the first base material layer 11 and the second base material layer 13, and the first conductor pattern 53 is located between the first and second interlayer connection conductors 55 and 57.

The RFID module 1 includes the first and second lands 41 and 43, which are electrodes arranged on the first main surface 3a side of the first base material layer 11, and the second electrode 47 facing the first and second lands 41 and 43 and connected to the first interlayer connection conductor 55. The first terminal 7a at the second end of the RFIC chip 7 is connected to the first land 41, and the second terminal 7b at a first end of the RFIC chip 7 is connected to the second land 43. The first land 41 and a first end of the first conductor pattern 53 are connected, and the wiring conductor 30 at a first end of the coil conductor 25 is connected to the second land 43. The second electrode 47 is positioned closer to the RFIC chip 7 than the first conductor pattern 53 is.

The second electrode 47 is located on the first main surface side of the second base material layer 13, while the first conductor pattern 53 is located on the second main surface side of the second base material layer 13. Since the second electrode 47 and the first conductor pattern 53 are arranged apart from each other, the generation of a capacitance component can be reduced between the first conductor pattern 53 and the first land 41 and the second land 43, thus making it easier to design the area of the second electrode 47 generating a capacitance component and the length of the first conductor pattern 53 generating inductance.

As further shown, the second conductor pattern 26 includes the plurality of first electrodes 27 that are each connected to the second ends of the pair of legs 31 of each of the plurality of coil elements 21, and the wiring conductor 28 that connects a first electrode 27 connected to one of the second ends of the pair of legs of the coil element 21 and a first electrode 27 connected to the other of the second ends of the pair of legs 31 of a coil element 21 adjacent to the coil element 21. The plurality of first electrodes 27 and the wiring conductor 28 are arranged on the first main surface 3a side of the first base material layer 11. As a result, the plurality of coil elements 21 can be arranged on the laminated substrate 3 to form the coil conductor 25.

Figure 9:
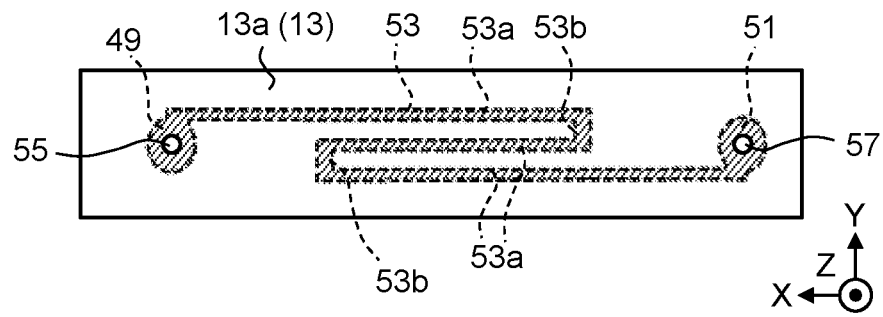
FIG. 9 is a plan view showing a wiring electrode in a variant of the exemplary embodiment.

A first variant of the exemplary embodiment will then be described with reference to FIG. 9. In particular, FIG. 9 is a transparent plan view showing the sixth main surface 13b of the intermediate second base material layer 13 in the first variant of the exemplary embodiment. The meandering first conductor pattern 53 may be arranged in an S-shape. The rectilinear pattern 53a extending from the auxiliary electrode 49 toward the auxiliary electrode 51 may be folded back near the center of the second base material layer 13 to extend toward the auxiliary electrode 49, and again folded back near the center of the second base material layer 13 to extend toward the auxiliary electrode 51. In the first variant, the two fold-back portions 53b are arranged on the second base material layer 13 near the center in the longitudinal direction thereof. Such a configuration can also provide the same effect as that of the RFID module 1 of the exemplary embodiment as described above.

Figure 10:
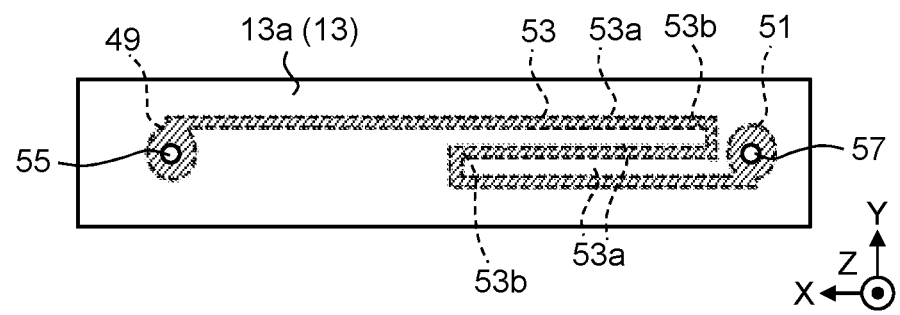
FIG. 10 is a plan view showing a wiring electrode in a variant of the exemplary embodiment.

A second variant of the exemplary embodiment will then be described with reference to FIG. 10. In particular, FIG. 10 is a transparent plan view seen through the fifth main surface 13a of the intermediate second base material layer 13 in the second variant of the embodiment. The rectilinear pattern 53a extending from the auxiliary electrode 51 toward the auxiliary electrode 49 may be folded back near the center of the second base material layer 13 to extend toward the auxiliary electrode 51, and folded back in the vicinity of the auxiliary electrode 51 to extend toward the auxiliary electrode 49. In the second variant, one of the two fold-back portions 53b is located on the second base material layer 13 near the center in the longitudinal direction thereof. Such a configuration can also provide the same effect as that of the RFID module 1 of the exemplary embodiment as described above.

Figure 11:
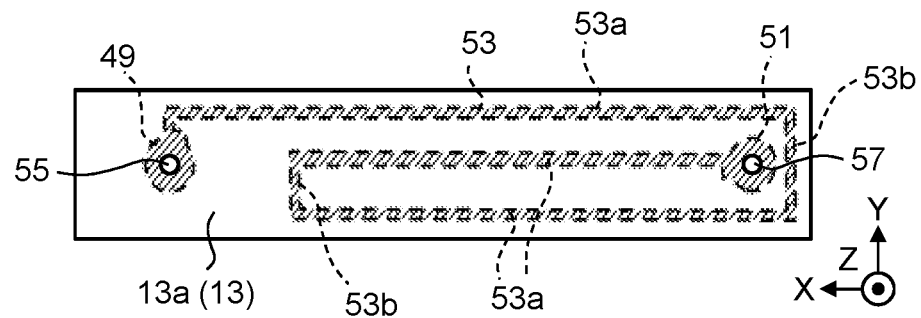
FIG. 11 is a plan view showing a wiring electrode in a variant of the exemplary embodiment.
Figure 12A:
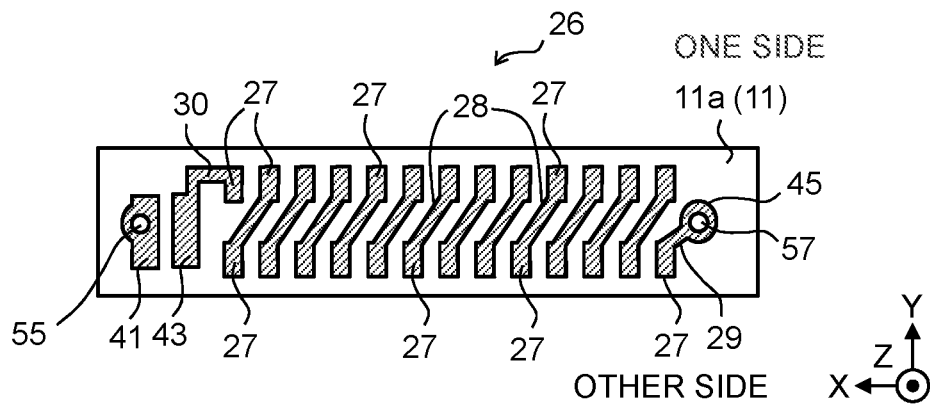
FIGS. 12A-12D are plan view showing base material layers of a laminated substrate in a variant of the exemplary embodiment.
Figure 12B:
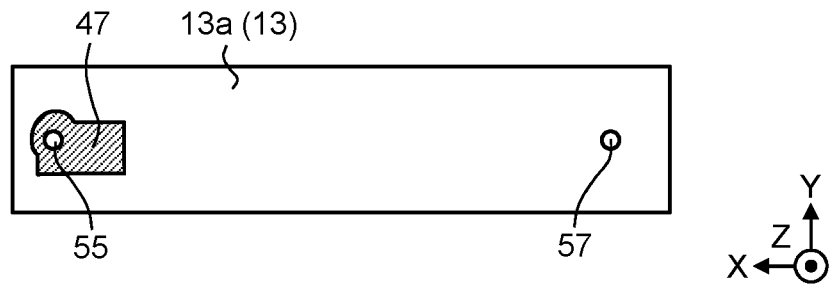
Figure 12C:
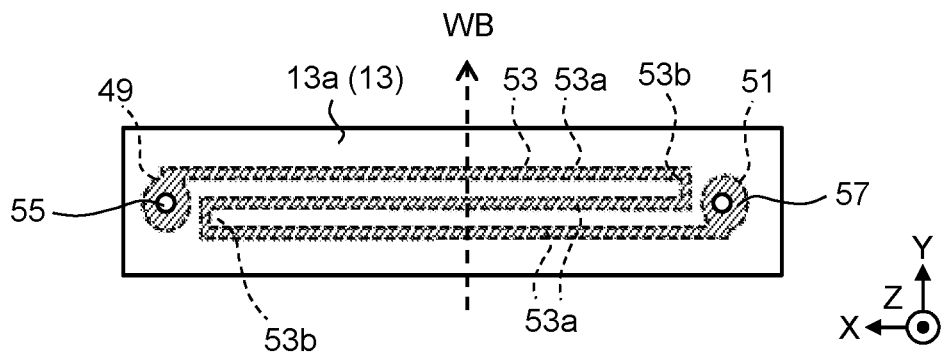
Figure 12D:
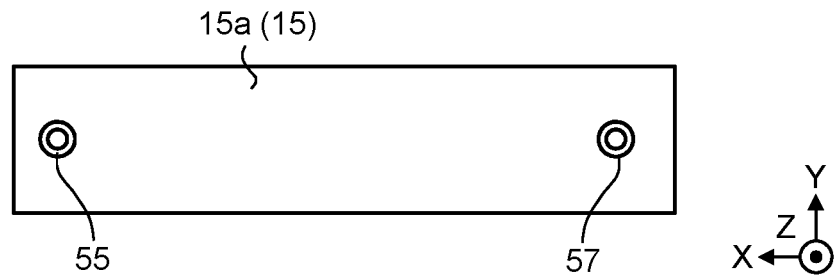

A third variant of the exemplary embodiment will then be described with reference to FIG. 11. In particular, FIG. 11 is a transparent plan view seen through the fifth main surface 13a of the intermediate second base material layer 13 in the third variant of the embodiment. The first conductor pattern 53 may be a loop pattern having fold-back portions instead of the meandering pattern. Such a configuration can also provide the same effect as that of the RFID module 1 of the exemplary embodiment as described above.

In general, it is noted that the exemplary aspects of the present disclosure are not limited to the embodiments described above, and can be modified and implemented as follows.

In the above embodiments, the amplitude direction of the meandering pattern of the first conductor pattern 53 is the longitudinal direction (i.e., the X-axis direction) of the second base material layer 13, but the exemplary embodiment is not limited thereto. For example, the amplitude direction of the meandering pattern of the first conductor pattern 53 can be the transverse direction (i.e., the Y-axis direction) of the second base material layer 13.

In the above embodiments, the first interlayer connection conductor 55 and the first land 41 are arranged inside the second land 43 in the longitudinal direction of the laminated substrate 3, but the exemplary embodiment is not limited thereto. As shown in FIGS. 12A to 12D, the first interlayer connection conductor 55 and the first land 41 can be arranged outside the second land 43 in the longitudinal direction of the laminated substrate 3.

Although the exemplary aspects of the present disclosure have been described in the embodiments with a certain degree of detail, the disclosed contents of these embodiments may vary in the details of the configurations, and the change in the combination and order of elements in each embodiment may be implemented without departing from the scope and ideas of the claimed invention.

EXPLANATION OF REFERENCES

1 RFID module
3 laminated substrate
3a first main surface
3b second main surface
5 coil assembly
7 RFIC chip
7a first terminal
7b second terminal
9 resin layer
11 first base material layer
11a third main surface
11b fourth main surface
13 second base material layer
13a fifth main surface
13b sixth main surface
15 third base material layer
15a seventh main surface
15b eighth main surface
16 first resist layer 17 second resist layer
21 coil element
23 block
23a side surface
25 coil conductor
27 first electrode
28, 29, 30 wiring conductor
31 leg
33 bridge
35 substrate connection
41 first land
43 second land
45 auxiliary electrode
47 second electrode
49, 51 auxiliary electrode
53 first conductor pattern
53a rectilinear pattern
53b fold-back portion
55 first interlayer connection conductor
57 second interlayer connection conductor
WA winding axis
WB center axis

The invention claimed is:

1. An RFID module comprising:
a substrate having a first main surface and a second main surface that oppose each other;
an RFIC chip on the first main surface of the substrate;
a coil conductor on the first main surface of the substrate and including a plurality of coil elements that each have a pair of legs and a bridge that connects first ends of the pair of legs, the plurality of coil elements arranged in a row across a winding axis;
a first conductor pattern within the substrate; and
a second conductor pattern on the first main surface of the substrate and connected with the coil elements to form a coil shape,
wherein a first end of the RFIC chip is connected to a first end of the coil conductor,
wherein the first conductor pattern is connected between a second end of the RFIC chip and a second end of the coil conductor, and
wherein the first conductor pattern has a fold-back portion where a direction in which the first conductor pattern extends is folded back.

2. The RFID module according to claim 1, wherein the first conductor pattern is a meandering pattern that has a rectilinear pattern that extends in a longitudinal direction of the substrate and the fold-back portion.

3. The RFID module according to claim 2, wherein the rectilinear pattern extends in a direction that is folded back.

4. The RFID module according to claim 1, wherein the substrate includes a first base material layer and a second base material layer, and the first base material layer is laminated on a first main surface of the second base material layer.

5. The RFID module according to claim 4, wherein the first conductor pattern is on the second base material layer.

6. The RFID module according to claim 5, wherein the RFID module comprises first and second interlayer connection conductors that each extend through the first base material layer and the second base material layer.

7. The RFID module according to claim 6,
wherein the first interlayer connection conductor connects the second end of the RFIC chip to a first end of the first conductor pattern, and
wherein the second interlayer connection conductor connects a second end of the first conductor pattern to a second end of the coil conductor.

8. The RFID module according to claim 7, wherein the first and second interlayer connection conductors confront each other in a longitudinal direction of the first base material layer and the second base material layer.

9. The RFID module according to claim 8, wherein the first conductor pattern is disposed between the first and second interlayer connection conductors.

10. The RFID module according to claim 7, wherein the first conductor pattern is disposed between the first and second interlayer connection conductors.

11. The RFID module according to claim 7, further comprising:
first and second land electrodes on a first main surface of the first base material layer; and
a second electrode facing the first and second land electrodes, the second electrode connected to the first interlayer connection conductor.

12. The RFID module according to claim 11, wherein the second end of the RFIC chip is connected to the first land electrode and the first end of the RFIC chip is connected to the second land electrode.

13. The RFID module according to claim 12, wherein the first land electrode is connected to the first end of the first conductor pattern, and the second land electrode is connected to a first end of the coil conductor.

14. The RFID module according to claim 13, wherein the second electrode is disposed at a positioned closer to the RFIC chip than the first conductor pattern.

15. The RFID module according to claim 14, wherein:
the second electrode is on the first main surface of the second base material layer, and
the first conductor pattern is on a second main surface side of the second base material layer.

16. The RFID module according to claim 15, wherein the substrate further includes a third base material layer on which the second main surface side of the second base material layer is disposed thereon.

17. The RFID module according to claim 4, wherein the second conductor pattern includes:
a plurality of first electrodes each connected to respective second ends of the pair of legs of each of the plurality of coil elements; and
a wiring conductor that connects one of the first electrodes connected to one of the second ends of the pair of legs of the respective coil element to another of the first electrodes connected to the other of the second ends of the pair of legs of a coil element adjacent to the respective coil element.

18. The RFID module according to claim 17, wherein the plurality of first electrodes and the wiring conductor are on a first main surface of the first base material layer.

19. An RFID module comprising:
a substrate having first and second main surfaces that oppose each other;
an RFIC chip on the first main surface of the substrate;
a coil conductor on the first main surface of the substrate, the coil conductor having first and second ends and including a plurality of coil elements in a row that each have a pair of legs and a bridge that connects the pair of legs;
a first conductor pattern in the substrate; and
a second conductor pattern on the first main surface of the substrate and connected with the coil elements, wherein a first end of the RFIC chip is connected to the first end of the coil conductor, and the first conductor pattern is connected between a second end of the RFIC chip and the second end of the coil conductor, and wherein the first conductor pattern has a fold-back portion.

20. The RFID module according to claim 19, wherein the first conductor pattern comprises a meandering shape that has a rectilinear pattern that extends in a longitudinal direction of the substrate and the fold-back portion, the rectilinear pattern extending in a direction that is folded back.

* * * * *